United States Patent
Sanderson et al.

(10) Patent No.: US 11,427,499 B2
(45) Date of Patent: Aug. 30, 2022

(54) PROCESS FOR DEPOSITING A LAYER (71) Applicant: PILKINGTON GROUP LIMITED, Lathom (GB)

(72) Inventors: Kevin Sanderson, Upholland (GB); Gary Nichol, Warrington (GB); Liam Palmer, Southport (GB); Peter Harris, Chester (GB); Jack Brown, Woolton (GB); Jun Ni, Maumee, OH (US); Lila R. Dahal, Perrysburg, OH (US)

(73) Assignee: Pilkington Group Limited, Lathom (GB)

(*) Notice: Subject to any disclaimer, the term of this patent is extended or adjusted under 35 U.S.C. 154(b) by 0 days.

(21) Appl. No.: 16/196,285

(22) Filed: Nov. 20, 2018

(65) Prior Publication Data

US 2019/0161400 A1 May 30, 2019

Related U.S. Application Data

(60) Provisional application No. 62/591,851, filed on Nov. 29, 2017.

(51) Int. Cl.
| | |
|---|---|
| *C23C 16/40* | (2006.01) |
| *C03C 17/245* | (2006.01) |
| *C23C 16/448* | (2006.01) |

(52) U.S. Cl.
CPC .......... *C03C 17/2456* (2013.01); *C23C 16/40* (2013.01); *C23C 16/405* (2013.01); *C23C 16/407* (2013.01); *C23C 16/4482* (2013.01); *C03C 2217/212* (2013.01); *C03C 2217/216* (2013.01); *C03C 2217/24* (2013.01); *C03C 2218/152* (2013.01)

(58) Field of Classification Search
CPC ...... C23C 16/405; C23C 16/40; C23C 16/482
See application file for complete search history.

(56) References Cited

U.S. PATENT DOCUMENTS

| | | | |
|---|---|---|---|
| 5,244,692 A * | 9/1993 | Zagdoun | ........... B32B 17/10174 427/110 |
| 7,132,691 B1 | 11/2006 | Tanabe et al. | |
| 2002/0182421 A1 | 12/2002 | Tixhon | |

(Continued)

FOREIGN PATENT DOCUMENTS

| | | |
|---|---|---|
| EP | 2641996 A1 | 9/2013 |
| JP | 2001279442 A | 10/2001 |

(Continued)

OTHER PUBLICATIONS

European Search Report dated Apr. 10, 2019 for Application No. EP 18 20 8668.

*Primary Examiner* — Joseph A Miller, Jr.
(74) *Attorney, Agent, or Firm* — Marshall & Melhorn, LLC (57) ABSTRACT

A process for depositing on a surface of a substrate a layer based on a metal oxide doped with magnesium or a mixed metal oxide containing magnesium. The process includes providing a substrate having a surface, forming a gaseous mixture comprising a non-halogenated source of a metal and a source of magnesium, delivering the gaseous mixture to the surface of the substrate, and depositing the layer based on a metal oxide doped with magnesium or a mixed metal oxide containing magnesium on the surface of the substrate.

17 Claims, 2 Drawing Sheets

(56) References Cited

U.S. PATENT DOCUMENTS

| | | | |
|---|---|---|---|
| 2003/0027000 A1* | 2/2003 | Greenberg | C03C 17/2456 |
| | | | 428/432 |
| 2003/0129307 A1 | 7/2003 | Lu et al. | |
| 2008/0149171 A1 | 6/2008 | Lu et al. | |
| 2009/0011206 A1 | 1/2009 | Schutz et al. | |
| 2009/0324827 A1* | 12/2009 | Miyoshi | C23C 16/045 |
| | | | 427/255.28 |
| 2010/0124642 A1 | 5/2010 | Lu et al. | |
| 2010/0295039 A1 | 11/2010 | Horio et al. | |
| 2012/0037201 A1 | 2/2012 | Buller et al. | |
| 2016/0264458 A1 | 9/2016 | McCamy et al. | |
| 2016/0268453 A1* | 9/2016 | McCamy | C23C 16/4412 |
| 2017/0066890 A1* | 3/2017 | Oser | C08J 7/06 |

FOREIGN PATENT DOCUMENTS

| | | | |
|---|---|---|---|
| JP | 2016014128 | A | 1/2016 |
| WO | 0128949 | A1 | 4/2001 |
| WO | 2016182465 | A1 | 11/2016 |
| WO | 2017093793 | A1 | 6/2017 |

\* cited by examiner

PROCESS FOR DEPOSITING A LAYER

BACKGROUND OF THE INVENTION

This invention relates to a process for depositing a layer on a surface of a substrate.

Photovoltaic (PV) modules or solar cells are material junction devices which convert sunlight into direct current (DC) electrical power. When exposed to sunlight (consisting of energy from photons), the electric field of PV module p-n junctions separates pairs of free electrons and holes, thus generating a photo-voltage. A circuit from n-side to p-side allows the flow of electrons when the PV module is connected to an electrical load, while the area and other parameters of the PV module junction determine the available current. Electrical power is the product of the voltage times the current generated as the electrons and holes recombine.

It is to be understood that in the context of the present invention the term "PV module" includes any assembly of components generating the production of an electric current between its electrodes by conversion of solar radiation, whatever the dimensions of the assembly, the voltage and the intensity of the produced current, and whether or not this assembly of components presents one or more internal electrical connection(s) (in series and/or parallel). The term "PV module" within the meaning of the present invention is thus here equivalent to "photovoltaic device" or "photovoltaic panel", as well as "photovoltaic cell", "solar cell" or "solar panel".

A PV module joins n-type and p-type materials, with a layer in between known as a junction. Even in the absence of light, a small number of electrons move across the junction from the n-type to the p-type semiconductor, producing a small voltage. In the presence of light, photons dislodge a large number of electrons, which flow across the junction to create a current which can be used to power electrical devices.

Traditional PV modules use silicon in the n-type and p-type layers. The newest generation of thin-film PV module uses thin layers of cadmium telluride (CdTe), amorphous or microcrystalline silicon, or copper indium gallium deselenide (CIGS) instead.

The semiconductor junctions are formed in different ways, either as a p-i-n device in amorphous silicon (a-Si), or as a hetero-junction (e.g. with a thin cadmium sulphide layer that allows most sunlight to pass through) for CdTe and CIGS. In their simplest form, a-Si cells suffer from significant degradation in their power output (in the range 15-35%) when exposed to the sun. Better stability requires the use of thinner layers, however, this reduces light absorption and hence cell efficiency. This has led the industry to develop tandem and even triple junction devices that contain p-i-n cells stacked on top of each other.

Generally a transparent conductive oxide (TCO) layer forms the front electrical contact of a thin film photovoltaic cell, and a metal layer forms the rear contact. The TCO may be based on doped zinc oxide (e.g. ZnO:Al [ZAO] or ZnO:B), tin oxide doped with fluorine ($SnO_2$:F) or an oxide material of indium and tin (ITO). These materials are deposited chemically, such as for example by chemical vapour deposition ("CVD"), or physically, such as for example by vacuum deposition by magnetron sputtering.

The TCO layer may be overlaid with a non-conductive undoped tin oxide buffer layer. A buffer layer, amongst other properties, provides a barrier between the conductive TCO layer and an absorbing CdTe device, preventing it from short circuiting.

Other material candidates for the buffer layer include magnesium doped metal oxides or mixed metal oxides containing magnesium. However it has been found that the deposition of magnesium doped metal oxides can undesirably suffer from blockages that adversely affect the magnesium content of the layers produced. It has also been established that such layers are prone to de-bond from the underlying surface upon washing. Therefore it would be advantageous to provide an improved process that alleviates the problems associated with known processes.

SUMMARY OF THE INVENTION

According to a first aspect of the present invention there is provided a process for depositing on a surface of a substrate a layer based on a metal oxide doped with magnesium or a mixed metal oxide containing magnesium, said process comprising:

providing a substrate having a surface, forming a gaseous mixture comprising a non-halogenated source of a metal and a source of magnesium, delivering the gaseous mixture to the surface of the substrate, and depositing the layer based on a metal oxide doped with magnesium or a mixed metal oxide containing magnesium on the surface of the substrate.

The inventors have surprisingly found that the use of a non-halogenated source of a metal enables the deposition of a layer based on a metal oxide doped with magnesium or a mixed metal oxide containing magnesium without the drawbacks of known processes.

In the context of the present invention, where a layer is said to be "based on" a particular material or materials, this means that the layer predominantly consists of the corresponding said material or materials, which means typically that it comprises at least about 50 at. % of said material or materials.

In the following discussion of the invention, unless stated to the contrary, the disclosure of alternative values for the upper or lower limit of the permitted range of a parameter, coupled with an indication that one of said values is more highly preferred than the other, is to be construed as an implied statement that each intermediate value of said parameter, lying between the more preferred and the less preferred of said alternatives, is itself preferred to said less preferred value and also to each value lying between said less preferred value and said intermediate value.

Throughout this specification, the term "comprising" or "comprises" means including the component(s) specified but not to the exclusion of the presence of other components. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, when referring to compositions, a composition consisting essentially of a set of components will comprise less than 5% by weight, typically less than 3% by weight, more typically less than 1% by weight of non-specified components.

The term "consisting of" or "consists of" means including the components specified but excluding other components.

Whenever appropriate, depending upon the context, the use of the term "comprises" or "comprising" may also be taken to include the meaning "consists essentially of" or "consisting essentially of", and also may also be taken to include the meaning "consists of" or "consisting of".

References herein such as "in the range x to y" are meant to include the interpretation "from x to y" and so include the values x and y.

In the context of the present invention a transparent material or a transparent substrate is a material or a substrate that is capable of transmitting visible light so that objects or images situated beyond or behind said material can be distinctly seen through said material or substrate.

In the context of the present invention the "thickness" of a layer is, for any given location at a surface of the layer, represented by the distance through the layer, in the direction of the smallest dimension of the layer, from said location at a surface of the layer to a location at an opposing surface of said layer.

In the context of the present invention a "derivative" is a chemical substance related structurally to another chemical substance and theoretically derivable from it.

Preferably the metal oxide doped with magnesium is selected from one or more of titanium oxide:Mg, aluminium oxide:Mg, tin oxide:Mg and zinc oxide:Mg. Most preferably the metal oxide doped with magnesium is titanium oxide:Mg.

Preferably the mixed metal oxide containing magnesium is selected from one or more of magnesium titanium oxide, magnesium aluminium oxide, magnesium tin oxide and magnesium zinc oxide. Most preferably the mixed metal oxide containing magnesium is magnesium titanium oxide.

Preferably the non-halogenated source of a metal is selected from one or more of a metal alkoxide, metal acetylacetonate, metal acetate, metal alkyl and derivatives.

Preferably the metal alkoxide is selected from one or more of a titanium alkoxide, aluminium alkoxide, tin alkoxide, zinc alkoxide and derivatives. Preferably the metal alkoxide is one or more metal isopropoxide, such as titanium tetraisopropoxide (TTIP), aluminium isopropoxide, tin isopropoxide, zinc isopropoxide and derivatives. Preferably the metal alkoxide is a titanium alkoxide, most preferably titanium tetraisopropoxide (TTIP).

The titanium alkoxide may be selected from one or more of titanium tetraisopropoxide (TTIP), titanium ethoxide (TET), titanium n-butoxide, titanium t-butoxide, di(i-propoxide)bis(2,2,6,6-tetramethyl-3,5-heptanedionato) titanium (IV), pentamethylcyclopentadienyltitanium trimethoxide, titanium (di-i-propoxide)bis(acetylacetonate) and derivatives. Preferably the titanium alkoxide is titanium tetraisopropoxide (TTIP). TTIP is beneficial in terms of its volatility and stability at relatively high temperatures. It also has the advantages of being readily available and low cost.

The aluminium alkoxide may be selected from one or more of aluminium isopropoxide, dimethylaluminium isopropoxide, aluminium ethoxide, aluminium s-butoxide, aluminium n-butoxide and derivatives. Preferably the aluminium alkoxide is aluminium isopropoxide.

The tin alkoxide may be selected from one or more of tin methoxide, tin ethoxide, tin n-butoxide, tin t-butoxide, tin n-propoxide, tin isopropoxide and derivatives. Preferably the tin alkoxide is tin isopropoxide.

The zinc alkoxide may be selected from one or more of zinc methoxide, zinc ethoxide, zinc n-butoxide, zinc t-butoxide, zinc n-propoxide, zinc isopropoxide and derivatives.

Preferably the metal acetylacetonate is selected from one or more of titanium acetylacetonate, aluminium acetylacetonate, tin acetylacetonate, zinc acetylacetonate and derivatives.

Preferably the metal acetate is selected from one or more of a titanium acetate such as titanium tetraacetate; an aluminium acetate such as aluminium monoacetate, aluminium diacetate or aluminium triacetate; a tin acetate such as tin diacetate, tin tetraacetate, methyl tin diacetate or dibutyltin diacetate (DBTA); a zinc acetate such as zinc diacetate or zincacetyl acetate; and derivatives.

Preferably the metal alkyl is selected from one or more of a titanium alkyl, aluminium alkyl, tin alkyl, zinc alkyl and derivatives.

Preferably the aluminium alkyl is selected from one or more of trimethyl aluminium, triethyl aluminium, triisobutyl aluminium and derivatives.

Preferably the tin alkyl is selected from one or more of tetramethyl tin, tetraethyl tin, tetraisobutyl tin and derivatives.

Preferably the zinc alkyl is selected from one or more of dimethyl zinc, diethyl zinc, di-n-propyl zinc, diisopropyl zinc, di-n-butyl zinc, diisobutyl zinc, di-sec-butyl zinc, di-t-butyl zinc, diphenyl zinc, dicyclohexyl zinc and derivatives.

Preferably the source of magnesium is selected from one or more of bis(cyclopentadienyl) magnesium (magnesocene), bis(methylcyclopentadienyl) magnesium (methyl magnesocene) and derivatives. Preferably the source of magnesium is bis(methylcyclopentadienyl) magnesium.

Preferably the layer based on a metal oxide doped with magnesium comprises at least 1 atomic % magnesium, more preferably at least 2 atomic % magnesium, even more preferably at least 2.5 atomic % magnesium, most preferably at least 3 atomic % magnesium, but preferably at most 20 atomic % magnesium, more preferably at most 15 atomic % magnesium, even more preferably at most 10 atomic % magnesium, most preferably at most 7 atomic % magnesium. These preferred ranges can provide advantages in terms of optimising solar cell efficiency.

The layer based on a metal oxide doped with magnesium or a mixed metal oxide containing magnesium can be deposited directly on the surface of the substrate. Alternatively, said layer based on a metal oxide doped with magnesium or a mixed metal oxide containing magnesium may be deposited indirectly on the surface of the substrate i.e. said layer based on a metal oxide doped with magnesium or a mixed metal oxide containing magnesium may be deposited over one or more previously deposited layers. For example, said layer based on a metal oxide doped with magnesium or a mixed metal oxide containing magnesium may be deposited over a layer based on a TCO such as flurorine doped tin oxide and/or over a layer based on silica. In some embodiments said layer based on a metal oxide doped with magnesium or a mixed metal oxide containing magnesium may be deposited over and contact a layer based on a TCO such as flurorine doped tin oxide, wherein said layer based on a TCO such as flurorine doped tin oxide may contact a subjacent layer based on silica. When the layer based on a metal oxide doped with magnesium or a mixed metal oxide containing magnesium contacts a layer based on a TCO, the layer based on a metal oxide doped with magnesium or a mixed metal oxide containing magnesium acts as a buffer layer and can also help with band alignment with an overlying absorbing CdTe device.

Where said layer based on a metal oxide doped with magnesium or a mixed metal oxide containing magnesium is deposited over and contacts a layer based on a TCO, preferably the layer based on a metal oxide doped with magnesium or a mixed metal oxide containing magnesium has a thickness of at least 20 nm, more preferably at least 30 nm, even more preferably at least 35 nm, most preferably at least 40 nm, but preferably at most 200 nm, more preferably at most 130 nm, even more preferably at most 110 nm, most preferably at most 100 nm.

In some alternative embodiments the layer based on a metal oxide doped with magnesium or a mixed metal oxide containing magnesium is deposited over and contacts a buffer layer such as a layer based on an undoped tin oxide. Preferably said buffer layer contacts a subjacent layer based on a TCO such as flurorine doped tin oxide. More preferably said layer based on a TCO such as flurorine doped tin oxide contacts a subjacent layer based on silica. When the layer based on a metal oxide doped with magnesium or a mixed metal oxide containing magnesium contacts a buffer layer, the layer based on a metal oxide doped with magnesium or a mixed metal oxide containing magnesium may assist with band alignment with an overlying absorbing CdTe device.

Where said layer based on a metal oxide doped with magnesium or a mixed metal oxide containing magnesium is deposited over and contacts a buffer layer such as a layer based on an undoped tin oxide, preferably the layer based on a metal oxide doped with magnesium or a mixed metal oxide containing magnesium has a thickness of at least 1 nm, more preferably at least 3 nm, even more preferably at least 4 nm, most preferably at least 5 nm, but preferably at most 20 nm, more preferably at most 15 nm, even more preferably at most 12 nm, most preferably at most 10 nm.

Preferably said surface of the substrate is a major surface of the substrate. Preferably the substrate is transparent. Preferably the substrate is a transparent glass substrate. The transparent glass substrate may be a clear metal oxide-based glass pane. Preferably the glass pane is a clear float glass pane, preferably a low iron float glass pane. By clear float glass, it is meant a glass having a composition as defined in BS EN 572-1 and BS EN 572-2 (2004). For clear float glass, the $Fe_2O_3$ level by weight is typically 0.11%. Float glass with an $Fe_2O_3$ content less than about 0.05% by weight is typically referred to as low iron float glass. Such glass usually has the same basic composition of the other component oxides i.e. low iron float glass is also a soda-lime-silicate glass, as is clear float glass. Typically low iron float glass has less than 0.02% by weight $Fe_2O_3$. Alternatively the glass pane is a borosilicate-based glass pane, an alkali-aluminosilicate-based glass pane, or an aluminium oxide-based crystal glass pane.

Preferably the process is carried out using Chemical Vapour Deposition (CVD). The CVD may be carried out in conjunction with the manufacture of the substrate, preferably a transparent glass substrate. In an embodiment, the transparent glass substrate may be formed utilizing the well-known float glass manufacturing process. In this embodiment, the transparent glass substrate may also be referred to as a glass ribbon. Conveniently the CVD may be carried out either in the float bath, in the lehr or in the lehr gap. The preferred method of CVD is atmospheric pressure CVD (e.g. online CVD as performed during the float glass process). However, it should be appreciated that the CVD process can be utilised apart from the float glass manufacturing process or well after formation and cutting of the glass ribbon.

Preferably, the formation of the gaseous mixture comprises heating the non-halogenated source of a metal and/or the source of magnesium. Precursor compounds may at some point be a liquid or a solid but may be volatile such that they can be vaporised or sublimed for use in a gaseous mixture. Once in a gaseous state, precursor compounds can be included in a gaseous stream and utilized in a CVD process.

Preferably the formation of the gaseous mixture comprises heating the non-halogenated source of a metal, the source of magnesium and/or any further precursor compound using a bubbler system or a thin film evaporator system. Thin film evaporator systems are particularly suited to production scale processes.

When a bubbler system is used, preferably the non-halogenated source of a metal, preferably TTIP, is heated to a temperature of at least 100° C., more preferably at least 130° C., even more preferably at least 140° C., most preferably at least 145° C., but preferably at most 200° C., more preferably at most 170° C., even more preferably at most 160° C., most preferably at most 155° C.

When a thin film evaporator system is used, preferably the non-halogenated source of a metal, preferably TTIP, is heated to a temperature of at least 110° C., more preferably at least 140° C., even more preferably at least 150° C., most preferably at least 155° C., but preferably at most 210° C., more preferably at most 180° C., even more preferably at most 170° C., most preferably at most 165° C.

When a bubbler system is used, preferably the source of magnesium is heated to a temperature of at least 100° C., more preferably at least 130° C., even more preferably at least 140° C., even more preferably at least 145° C., most preferably at least 146° C., but preferably at most 200° C., more preferably at most 170° C., even more preferably at most 160° C., most preferably at most 155° C. These preferred ranges are beneficial in terms of improving and controlling the magnesium content of the layer based on a metal oxide or a mixed metal oxide containing magnesium.

When a thin film evaporator system is used, preferably the source of magnesium is heated to a temperature of at least 110° C., more preferably at least 140° C., even more preferably at least 150° C., most preferably at least 155° C., but preferably at most 210° C., more preferably at most 180° C., even more preferably at most 170° C., most preferably at most 165° C. Again, these preferred ranges are beneficial in terms of improving and controlling the magnesium content of the layer based on a metal oxide or a mixed metal oxide containing magnesium.

Preferably the gaseous mixture reaches a vapour pressure of at least 0.01 Bar, more preferably at least 0.03 Bar, even more preferably at least 0.04 Bar, most preferably at least 0.05 Bar.

The gaseous mixture may further comprise one or more carrier gas or diluents, for example, nitrogen, air and/or helium, preferably nitrogen. Thus, the process may further comprise providing a source of the one or more carrier gas or diluents from which separate supply lines may extend.

Preferably, the gaseous mixture is delivered to a coating apparatus. In certain embodiments, the gaseous mixture is fed through a coating apparatus and discharged from the coating apparatus utilizing one or more gas distributor beams prior to deposition of the layer based on a metal oxide doped with magnesium or a mixed metal oxide containing magnesium. Preferably, the gaseous mixture is formed prior to being fed through the coating apparatus. For example, the non-halogenated source of a metal and source of magnesium, and preferably a carrier gas or diluent such as nitrogen, may be mixed in a feed line connected to an inlet of the coating apparatus. In other embodiments, the gaseous mixture may be formed within the coating apparatus.

The gaseous mixture may be directed toward and along the substrate. Utilising a coating apparatus aids in directing the gaseous mixture toward and along the substrate. Preferably, the gaseous mixture is directed toward and along the substrate in a laminar flow.

Preferably, the coating apparatus extends transversely across the substrate and is provided at a predetermined distance thereabove. The coating apparatus is preferably located at, at least, one predetermined location. When the process is utilised in conjunction with the float glass manufacturing process, the coating apparatus is preferably provided within the float bath section thereof. However, the coating apparatus may be provided in the annealing lehr, and/or in the gap between the float bath and the annealing lehr.

It is desirable that the gaseous mixture be kept at a temperature below the thermal decomposition temperature of the non-halogenated source of a metal and source of magnesium to prevent pre-reaction before the mixture reaches the surface of the substrate. Within the coating apparatus, the gaseous mixture is preferably maintained at a temperature below that at which it reacts and is delivered to a location near the surface of the substrate, the substrate being at a temperature above the reaction temperature. The gaseous mixture may react at or near the surface of the substrate to deposit the layer based on a metal oxide doped with magnesium or a mixed metal oxide containing magnesium on said surface.

The process, preferably a CVD process, may preferably be carried out when the substrate, preferably a transparent glass substrate, is at a temperature in the range 450° C. to 800° C., more preferably when the transparent glass substrate is at a temperature in the range 550° C. to 750° C. Depositing a layer by CVD when the substrate is at these preferred temperatures affords greater crystallinity of the layer, which can improve toughenability (resistance to heat treatment).

The CVD process may be a dynamic process in which the substrate is moving at the time of deposition. Preferably, during deposition the substrate moves at a predetermined rate of, for example, greater than 3 m/min, more preferably between 3 m/min and 20 m/min.

As detailed above, preferably the CVD may be carried out during the float glass production process at substantially atmospheric pressure. Alternatively the CVD may be carried out using low-pressure CVD or ultrahigh vacuum CVD. The CVD may be carried out using aerosol assisted CVD or direct liquid injection CVD. Furthermore, the CVD may be carried out using microwave plasma-assisted CVD, plasma-enhanced CVD, remote plasma-enhanced CVD, atomic layer CVD, combustion CVD (flame pyrolysis), hot wire CVD, metalorganic CVD, rapid thermal CVD, vapour phase epitaxy, or photo-initiated CVD. The glass substrate will usually be cut into sheets after deposition of any CVD layer(s) for storage or convenient transport.

The gaseous mixture may also comprise one or more oxygen-containing compound. Preferably the oxygen-containing compound is selected from one or more of organic oxygen-containing compounds or inorganic oxygen-containing compounds. Preferably the one or more oxygen-containing compound is one or more organic oxygen-containing compound.

The organic oxygen-containing compound may be one or more carbonyl compound. Preferably, the carbonyl compound is an ester. More preferably, the carbonyl compound is an ester having an alkyl group with a β-hydrogen. Alkyl groups with a β-hydrogen containing two to ten carbon atoms are preferred. Preferably, the ester is selected from one or more of ethyl acetate (EtoAc), ethyl formate, ethyl propionate, isopropyl formate, isopropyl acetate, n-butyl acetate and t-butyl acetate. Most preferably the one or more oxygen-containing compound is a mixture of both t-butyl acetate and ethyl acetate.

In another embodiment, the oxygen-containing compound may be provided as a part of a gaseous composition such as air. Alternatively, oxygen is provided in a substantially purified form. In either of these two embodiments, oxygen is provided in the form of molecular oxygen. The inorganic oxygen-containing compound may be selected from one or more of water ($H_2O$), carbon dioxide ($CO_2$), nitric oxide (NO), nitrogen dioxide ($NO_2$), and nitrous oxide ($N_2O$). The gaseous mixture may comprise 0.1-5% by volume of the non-halogenated source of a metal. Preferably, the gaseous mixture comprises 0.1-2% of the non-halogenated source of a metal. More preferably, the gaseous mixture comprises 0.1-1.5% of the non-halogenated source of a metal.

Where the substrate is a glass substrate, preferably said surface of the substrate is the gas side surface. Coated glass manufacturers usually prefer depositing coatings on the gas side surface (as opposed to the tin side surface for float glass) because deposition on the gas side surface can improve the properties of the coating.

Preferably the layer based on a metal oxide doped with magnesium or a mixed metal oxide containing magnesium may be deposited at a deposition rate of at least 2.5 nm per second (nm/sec), more preferably at least 5.0 nm/sec, even more preferably at least 10.0 nm/sec or more, but preferably at most 60 nm/sec, more preferably at most 50 nm/sec, even more preferably at most 40 nm/sec. In certain embodiments, said layer is deposited at a dynamic deposition rate of 280 nm×m/m in or more.

According to a second aspect of the present invention there is provided the use of a non-halogenated source of a metal to reduce the occurrence of blockages during the deposition of a layer based on a metal oxide doped with magnesium or a mixed metal oxide containing magnesium on a surface of a substrate.

According to a third aspect of the present invention there is provided the use of a non-halogenated source of a metal, during the deposition of a layer based on a metal oxide doped with magnesium or a mixed metal oxide containing magnesium on a surface of a substrate, to improve the bonding between said layer based on a metal oxide doped with magnesium or a mixed metal oxide containing magnesium and said surface of a substrate.

Any feature set out above in relation to the first aspect of the present invention may also be utilised in relation to the second and third aspects of the present invention.

Any invention described herein may be combined with any feature of any other invention described herein mutatis mutandis.

It will be appreciated that optional features applicable to one aspect of the invention can be used in any combination, and in any number. Moreover, they can also be used with any of the other aspects of the invention in any combination and in any number. This includes, but is not limited to, the dependent claims from any claim being used as dependent claims for any other claim in the claims of this application.

The reader's attention is directed to all papers and documents which are filed concurrently with or previous to this specification in connection with this application and which are open to public inspection with this specification, and the contents of all such papers and documents are incorporated herein by reference. All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

BRIEF DESCRIPTION OF THE DRAWINGS

The invention will now be further described by way of the following specific embodiments, which are given by way of illustration and not of limitation, with reference to the accompanying drawings in which.

DETAILED DESCRIPTION OF THE INVENTION

Figure 1:
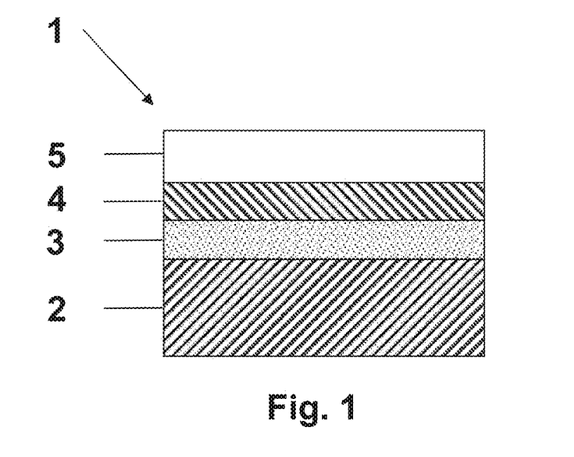
FIG. 1 is a schematic view, in cross-section, of a coated glazing in accordance with certain embodiments of the present invention.

FIG. 1 shows a cross-section of a coated glazing 1 according to certain embodiments of the present invention. Coated glazing 1 comprises a transparent float glass substrate 2 that has been sequentially coated using CVD with a layer based on $SiO_2$ 3, a layer based on fluorine doped tin oxide ($SnO_2$:F) 4 and a layer based on magnesium doped titanium oxide ($TiO_2$:Mg) 5.

As discussed above, the process of the present invention may be carried out using CVD in conjunction with the manufacture of the glass substrate in the float glass process. The float glass process is typically carried out utilizing a float glass installation such as the installation 10 depicted in FIG. 2. However, it should be understood that the float glass installation 10 described herein is only illustrative of such installations.

Figure 2:
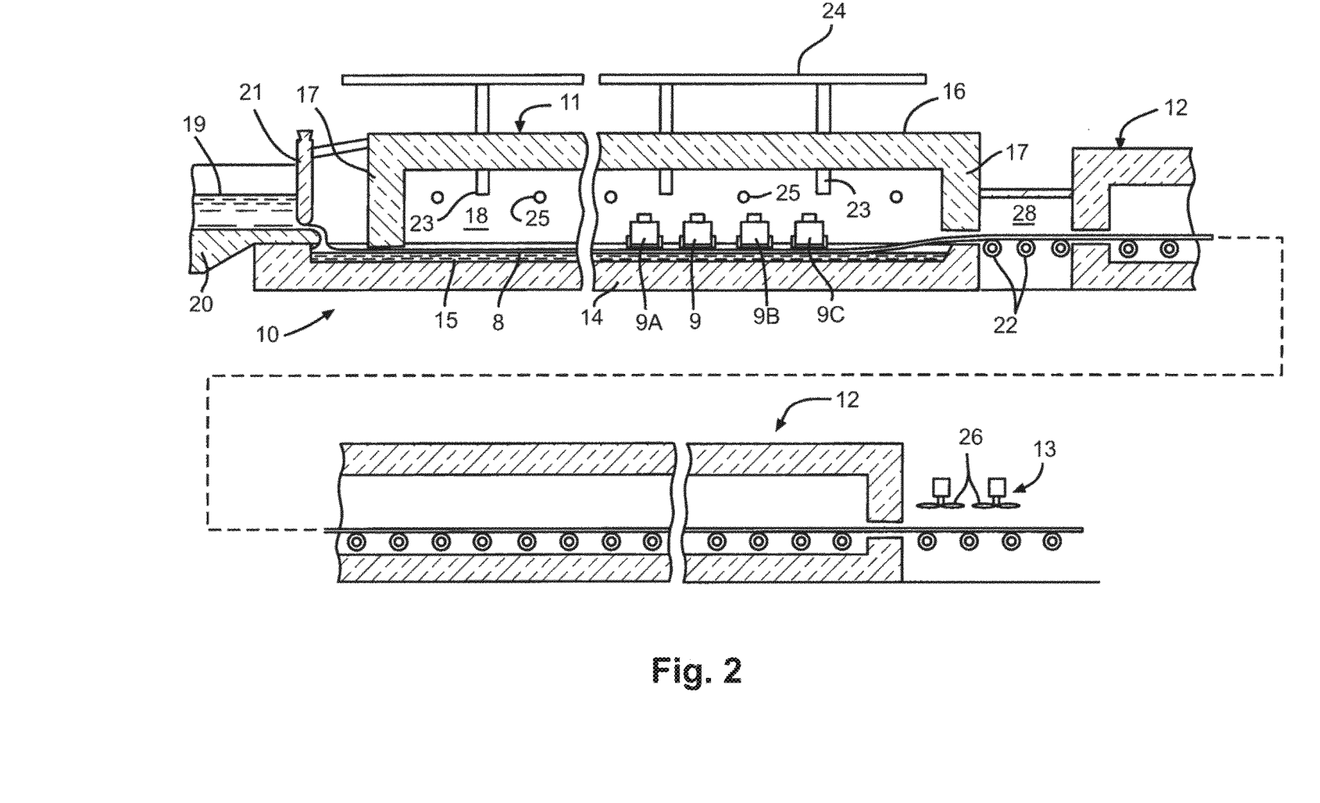
FIG. 2 is a schematic view, in vertical section, of an installation for practicing the float glass process which incorporates several CVD apparatuses for manufacturing a coated glazing in accordance with certain embodiments of the present invention.

As illustrated in FIG. 2, the float glass installation 10 may comprise a canal section 20 along which molten glass 19 is delivered from a melting furnace, to a float bath section 11 wherein the glass substrate is formed. In this embodiment, the glass substrate will be referred to as a glass ribbon 8. However, it should be appreciated that the glass substrate is not limited to being a glass ribbon. The glass ribbon 8 advances from the bath section 11 through an adjacent annealing lehr 12 and a cooling section 13. The float bath section 11 includes: a bottom section 14 within which a bath of molten tin 15 is contained, a roof 16, opposite side walls (not depicted) and end walls 17. The roof 16, side walls and end walls 17 together define an enclosure 18 in which a non-oxidizing atmosphere is maintained to prevent oxidation of the molten tin 15.

In operation, the molten glass 19 flows along the canal 20 beneath a regulating tweel 21 and downwardly onto the surface of the tin bath 15 in controlled amounts. On the molten tin surface, the molten glass 19 spreads laterally under the influence of gravity and surface tension, as well as certain mechanical influences, and it is advanced across the tin bath 15 to form the glass ribbon 8. The glass ribbon 8 is removed from the bath section 11 over lift out rolls 22 and is thereafter conveyed through the annealing lehr 12 and the cooling section 13 on aligned rolls. The deposition of coatings preferably takes place in the float bath section 11, although it may be possible for deposition to take place further along the glass production line, for example, in the gap 28 between the float bath 11 and the annealing lehr 12, or in the annealing lehr 12.

As illustrated in FIG. 2, four CVD apparatuses 9, 9A, 9B, 9C are shown within the float bath section 11. Thus, depending on the frequency and thickness of the coating layers required it may be desirable to use some or all of the CVD apparatuses 9, 9A, 9B, 9C. One or more additional coating apparatuses (not depicted) may be provided. One or more CVD apparatus may alternatively or additionally be located in the lehr gap 28. Any by-products are removed through coater extraction slots and then through a pollution control plant. For example, in an embodiment, a silica layer is formed utilizing using CVD apparatus 9A, a fluorine doped tin oxide layer is formed utilizing CVD apparatus 9, and adjacent apparatuses 9B and 9C are utilized to form a magnesium doped titanium oxide layer.

A suitable non-oxidizing atmosphere, generally nitrogen or a mixture of nitrogen and hydrogen in which nitrogen predominates, may be maintained in the float bath section 11 to prevent oxidation of the molten tin 15 comprising the float bath. The atmosphere gas is admitted through conduits 23 operably coupled to a distribution manifold 24. The non-oxidizing gas is introduced at a rate sufficient to compensate for normal losses and maintain a slight positive pressure, on the order of between about 0.001 and about 0.01 atmosphere above ambient atmospheric pressure, so as to prevent infiltration of outside atmosphere. For the purposes of describing the invention, the above-noted pressure range is considered to constitute normal atmospheric pressure.

CVD is generally performed at essentially atmospheric pressure. Thus, the pressure of the float bath section 11, annealing lehr 12, and/or in the gap 28 between the float bath 11 and the annealing lehr 12 may be essentially atmospheric pressure. Heat for maintaining the desired temperature regime in the float bath section 11 and the enclosure 18 is provided by radiant heaters 25 within the enclosure 18. The atmosphere within the lehr 12 is typically atmospheric air, as the cooling section 13 is not enclosed and the glass ribbon 8 is therefore open to the ambient atmosphere. The glass ribbon 8 is subsequently allowed to cool to ambient temperature. To cool the glass ribbon 8, ambient air may be directed against the glass ribbon 8 by fans 26 in the cooling section 13. Heaters (not shown) may also be provided within the annealing lehr 12 for causing the temperature of the glass ribbon 8 to be gradually reduced in accordance with a predetermined regime as it is conveyed therethrough.

EXAMPLES

All Comparative Examples and Examples of the invention were prepared on an on-line coatings mini dynamic coater.

The glass dimensions were 10 cm×45 cm for the samples coated with magnesium doped titania and 30 cm×120 cm for the samples coated with a mixed oxide of magnesium and zinc. Samples were prepared using CVD. A furnace set at 600° C. and a total flow rate of 12 standard litres per minute (slm) were used for the deposition of magnesium doped titania coatings. A furnace set at 630° C. and a total flow rate of 36 standard litres per minute (slm) were used for the deposition of a mixed oxide of magnesium and zinc. The mini dynamic coater produces dynamic samples by moving a heated substrate beneath a coater head allowing the chemical vapour to evenly coat the substrate. The speed of the substrate can vary between 1-4 m/min.

Oxygen-free nitrogen was used as the carrier gas, supplied by a boil off liquid nitrogen feed or oxygen free nitrogen gas cylinders. Titanium tetrachloride ($TiCl_4$) and titanium iso-propoxide (TTIP) were used as titanium precursors, heated to temperatures varying between 50-180° C. (dependant on precursor) and then delivered via a bubbler. Diethylzinc (DEZ, $Zn(CH_2CH_3)_2$) was used as a zinc precursor, heated to a temperature of 100° C. and then delivered via a bubbler. Ethyl Acetate (EtOAc, 99.7% Sigma-Aldrich), tertiary butyl acetate (TBAc, <99.9% Sigma-Aldrich) or nitrous oxide ($N_2O$, 99% Sigma-Aldrich) were used as oxidants in some of the reactions. Oxidants were delivered via 20 $cm^3$ syringe, inserted into a watlow tube heater, set to 200° C. or, in the case of the deposition of a mixed oxide of magnesium and zinc, the Ethyl Acetate and tertiary butyl acetate were heated to a temperature of 65° C. and 85° C. respectively and delivered via a bubbler. All gas flows were controlled by Bronkhorst™ Mass-View, Mass Flow controllers. All magnesium doped titania coatings were deposited on NSG TEC™ SB or NSG TEC™ 15. All coatings of mixed oxide of magnesium and zinc were deposited on NSG TEC™ SB.

Computer modelling was used to estimate $Ti_xO_yMg_z$ layer thickness. Ultrascan measurements were made for each sample then, using their b*, Y (glass reflection) properties and modelling software, a thickness of coating was estimated.

Comparative Examples: $Mg(MeCp)_2+TiCl_4+TBAc \rightarrow Ti_xO_yMg_z$

Comparative Examples were prepared using methyl magnesocene, titanium tetrachloride and tertiary butyl acetate with the conditions set out in Table 1 below with a line speed of 1/m/min to deposit a magnesium doped titania layer. The temperatures indicated in Table 1 refer to the temperature to which the methyl magnesocene or titanium tetrachloride was heated prior to delivery via a bubbler to form a gaseous mixture. Table 1 also shows the thickness of the layers obtained.

Comparative Examples 1-3 were analysed both before washing and after washing (using deionised water in an ultrasonic bath) by X-ray photoelectron spectroscopy (XPS) using a Thermo K-alpha instrument which found no evidence for Mg doping in the titania layers. Mg was only detected as a surface contaminant. However, the detection limit of XPS is of the order of 0.5 atomic %, and it is therefore possible that Mg is present as a dopant at a lower concentration, undetectable by XPS.

Time-of-Flight Secondary Ion Mass Spectrometry (ToF-SIMS) analysis of Comparative Example 1 using an ION-TOF 5 Time of Flight Secondary Ion Mass Spectrometer suggested that Mg was present within the titania layer, both in depth profiling (i.e. analysis of the variation of composition with depth below the initial surface of the layer) and using Mg:Ca ratios. However ToF-SIMS does not provide any information regarding the level of Mg doping in the titania layer.

Figure 3:
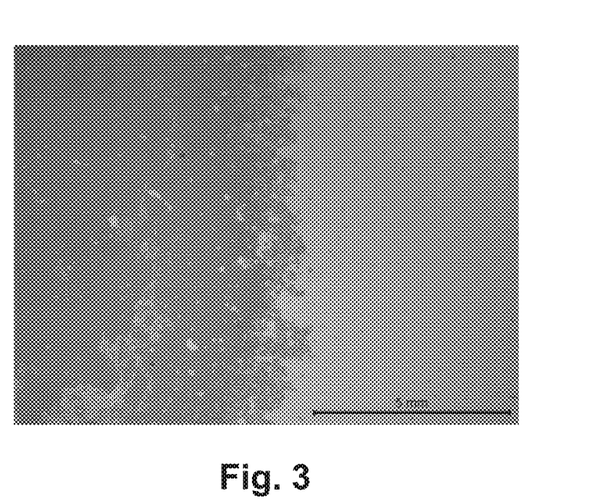
FIG. 3 is a SEM image of Comparative Example 1 following washing.

Scanning electron microscope (SEM) analysis of Comparative Example 1 (using an FEI Nova NanoSEM 450 and EDAX Octane plus EDS detector with TEAM software) showed that once washed, large regions of the titania layer had de-bonded from the substrate (see FIG. 3 which is a SEM image of Comparative Example 1 following washing). FIG. 3 shows a dark region on the left of the image where the titania layer has de-bonded and consequently been removed by the washing process. The lighter region to the right of the image is a region where the titania coating remains following washing.

Comparative Example 2 was analysed by X-ray diffraction (XRD) using an X'pert MRD—PANalytical instrument which identified the titania layer as merely anatase titania, with no Mg dopant detected.

In addition, whilst performing CVD to prepare Comparative Examples 1-3, regular blockages in the coating equipment occurred near and around the $Mg(MeCp)_2$ bubbler, and mix pipe, connecting the manifold to the coater head. Accordingly, an alternative process was sought.

Examples:

Samples were prepared using methyl magnesocene and titanium tetraisopropoxide with the conditions set out in Table 2 below to deposit a magnesium doped titania layer. The temperatures indicated in Table 2 refer to the temperature to which the methyl magnesocene or titanium tetraisopropoxide was heated prior to delivery via a bubbler to form a gaseous mixture. The substrate used for Examples 1-4 and 6-9 was NSG TEC™ SB, while the substrate used for Example 5 was NSG TEC™ 15. The line speed was 1 m/m in and the flow rate for TTIP was 1 slm for Examples 1-9. Table 2 also shows the atomic percentages, stoichiometry and thickness of the layers obtained.

TABLE 1

Summary of conditions and obtained layer thicknesses for CVD using $Mg(MeCp)_2$ + $TiCl_4$ + TBAc

| Comparative Example | Substrate | $Mg(MeCP)_2$ Temp (° C.) | $Mg(MeCP)_2$ Flow (slm) | $TiCl_4$ Temp (° C.) | $TiCl_4$ Flow (slm) | TBAc Syringe Flow (cc/hr) | Layer Thickness (nm) |
|---|---|---|---|---|---|---|---|
| 1 | NSG TEC™ SB | 180 | 1.2 | 90 | 1 | 66.5 | 85 |
| 2 | NSG TEC™ 15 | 180 | 1.2 | 89 | 1 | 66.5 | 28 |
| 3 | NSG TEC™ 15 | 180 | 1 | 91 | 1 | 66.5 | 24 |

TABLE 2

Summary of conditions and obtained layers for CVD using Mg(MeCp)$_2$ + TTIP

| Example | Mg(MeCP)$_2$ Temp (°C.) | Mg(MeCP)$_2$ Flow (slm) | TTIP Temp (°C.) | Concentration of elements in deposited layer (atomic %) | Stoichiometry of deposited layer | Layer thickness (nm) |
|---|---|---|---|---|---|---|
| 1 | 115 | 1 | 154 | Ti (37.5), O (62.5) | TiO$_{1.7}$ | 32.4 |
| 2 | 132 | 1 | 154 | Ti (37.7), O (62.3) | TiO$_{1.7}$ | 30.4 |
| 3 | 146 | 1 | 155 | Ti (37.3), O (61.5), Mg (1.2) | TiO$_{1.6}$ | 36.7 |
| 4 | 148 | 1 | 155 | Ti (37.7), O (62.2), Mg (0.1) | TiO$_{1.7}$ | 20-30 |
| 5 | 149 | 0.25 | 150 | Ti (30.9), O (60.0), Mg (7.7), C (0.7), Na (0.7) | TiO$_{1.9}$Mg$_{0.2}$ | 14 |
| 6 | 150 | 1 | 155 | Ti (34.3), O (61.1), Mg (4.6) | TiO$_{1.8}$Mg$_{0.1}$ | 20-30 |
| 7 | 152 | 1 | 155 | Ti (10.8), O (45.6), Mg (25.5), C(18.1) | TiO$_{4.2}$Mg$_{2.4}$C$_{1.7}$ | 20-30 |
| 8 | 160 | 1 | 155 | Ti (20.4), O (58.1), Mg (21.5) | TiO$_{2.8}$Mg | 14.4 |
| 9 | 176 | 1 | 155 | Ti (8.3), O (55.3), Mg (35.8), C (0.6) | MgO$_{1.5}$Ti$_{0.2}$ | 8 |

Examples 1-9 were analysed via XPS as detailed above to determine the concentration of elements in the deposited layers. Table 2 shows that layers of titania doped with magnesium can be reliably deposited using the non-halogenated precursor TTIP. The level of Mg dopant present in the deposited layer generally varies with the temperature to which methyl magnesocene is heated. As noted previously, ranges of around 1-15 atomic % can provide advantages in terms of optimising solar cell efficiency.

It is worth noting that the preparation of Examples 1-9 did not suffer from the regular blockages that were experienced with the use of a halogenated source of titanium. Furthermore, Examples 1-9 exhibited no de-bonding upon washing.

Examples: DEZ+[Mg(MeCp)$_2$ or MgCp$_2$]+[TBAc, EtOAc or N$_2$O]→Zn$_x$O$_y$Mg$_z$ Samples were prepared using methyl magnesocene or magnesocene and DEZ with the conditions set out in Table 3 below to deposit a layer of a mixed oxide of magnesium and zinc. The MgCp$_2$ and Mg(MeCp)$_2$ were heated to a temperature of 200° C. and 180° C. respectively prior to delivery via a bubbler to form a gaseous mixture. Example 14 was carried out in the presence of 15% ethylene by volume of the total gas flow. A line speed of 5 m/min was used in the preparation of Examples 10-12, whilst for Examples 13 and 14 a line speed of 3.8 m/min was used. Table 3 also shows the relative atomic percentages of Zn and Mg and thickness of the layers obtained.

Examples 10-14 were analysed via XPS as detailed above to determine the concentration of elements in the deposited layers. Table 3 shows that layers of mixed oxide of magnesium and zinc can be reliably deposited using the non-halogenated precursor DEZ. The level of Mg present in the deposited layer generally varies with the proportion of the Mg precursor in the total gas flow.

It is worth noting that the preparation of Examples 10-14 did not suffer from blockages and the samples obtained exhibited no de-bonding upon washing.

The invention is not restricted to the details of the foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A process for depositing on a surface of a transparent glass substrate a layer based on a metal oxide doped with magnesium or a mixed metal oxide containing magnesium, said process comprising:
    providing a transparent glass substrate having a surface,
    forming a gaseous mixture comprising a non-halogenated source of a metal and a source of magnesium, the source of magnesium being selected from one or more of bis(cyclopentiadienyl) magnesium (magnesocene) and bis(methylcyclopentadienyl) magnesium,

TABLE 3

Summary of conditions and obtained layers for CVD using DEZ + [Mg(MeCp)$_2$ or MgCp$_2$] + [TBAc, EtOAc or N$_2$O]

| | Percentage volume of total gas flow | | | | Relative atomic percentage | |
|---|---|---|---|---|---|---|
| | Zn | Mg | | Layer | | |
| Example | precursor DEZ | precursor MgCp$_2$ | Oxidant TBAc | thickness (nm) | Zn/ (Zn + Mg) | Mg/ (Zn + Mg) |
| 10 | 1.0% | 1.0% | 5.0% | 62.0 | 40.5% | 59.5% |
| 11 | 1.5% | 1.5% | 10.0% | 67.5 | 25.0% | 75.0% |
| 12 | 1.5% | 0.5% | 10.0% | 33.0 | 66.7% | 33.3% |
| | DEZ | MgCp$_2$ | EtOAc | | | |
| 13 | 2.0% | 0.5% | 5.0% | 34.8 | 66.7% | 33.3% |
| | DEZ | Mg(MeCp)$_2$ | N$_2$O | | | |
| 14 | 0.8% | 0.1% | 10.0% | 18.0 | 82.1% | 17.9% | delivering the gaseous mixture to the surface of the substrate, and depositing the layer based on a metal oxide doped with magnesium or a mixed metal oxide containing magnesium on the surface of the substrate, wherein the process is carried out using chemical vapour deposition carried out in conjunction with the manufacture of the substrate formed utilizing a float glass manufacturing process;

wherein said layer based on a metal oxide doped with magnesium or a mixed metal oxide containing magnesium has a thickness of at least 1 nm and at most 20 nm and is deposited over and contacts a buffer layer based on an undoped tin oxide; and wherein said buffer layer contacts a subjacent layer based on a transparent conductive oxide and said layer based on a transparent conductive oxide contacts a subjacent layer based on silica.

2. The process according to claim 1, wherein the non-halogenated source of a metal is selected from one or more of a metal alkoxide, metal acetylacetonate, metal acetate, and metal alkyl.

3. The process according to claim 2, wherein the metal alkoxide is titanium tetraisopropoxide (TTIP).

4. The process according to claim 2, wherein the metal acetylacetonate is titanium acetylacetonate.

5. The process according to claim 2, wherein the metal acetate is selected from one or more of a titanium acetate.

6. The process according to claim 2, wherein the metal alkyl is a titanium alkyl.

7. The process according to claim 1, wherein the layer based on a metal oxide doped with magnesium comprises at least 1 atomic % magnesium and at most 20 atomic % magnesium.

8. The process according to claim 1, wherein the formation of the gaseous mixture comprises heating the source of magnesium using a thin film evaporator system to a temperature of at least 110° C. and at most 210° C.

9. The process according to claim 1, wherein the gaseous mixture further comprises one or more carrier gas or diluents.

10. The process according to claim 1, wherein the layer based on a metal oxide doped with magnesium or a mixed metal oxide containing magnesium is deposited over the surface of the substrate with one or more previously deposited, intervening layers.

11. The process according to claim 2, wherein the metal alkoxide is a titanium alkoxide.

12. The process according to claim 2, wherein the metal acetate is titanium tetraacetate.

13. The process according to claim 1, wherein the metal oxide doped with magnesium is titanium oxide:Mg or wherein the mixed metal oxide containing magnesium is magnesium titanium oxide.

14. The process according to claim 1, wherein the layer based on a metal oxide doped with magnesium comprises at least 2.5 atomic % magnesium and at most 10 atomic % magnesium.

15. The process according to claim 1, wherein the formation of the gaseous mixture comprises heating the source of magnesium using a thin film evaporator system to a temperature of at least 140° C. and at most 180° C.

16. The process according to claim 1, wherein the formation of the gaseous mixture comprises heating the source of magnesium using a thin film evaporator system to a temperature of at least 150° C. and at most 170° C.

17. The process according to claim 1, wherein the formation of the gaseous mixture comprises heating the source of magnesium using a thin film evaporator system to a temperature of at least 155° C. and at most 165° C.

* * * * *